United States Patent
Sun et al.

(10) Patent No.: US 10,474,790 B2
(45) Date of Patent: Nov. 12, 2019

(54) LARGE SCALE DISTRIBUTED SIMULATION FOR REALISTIC MULTIPLE-AGENT INTERACTIVE ENVIRONMENTS

(71) Applicant: TuSimple, San Diego, CA (US)

(72) Inventors: Xing Sun, San Diego, CA (US); Wutu Lin, San Diego, CA (US); Yufei Zhao, San Diego, CA (US); Liu Liu, San Diego, CA (US)

(73) Assignee: TUSIMPLE, San Diego, CA (US)

( * ) Notice: Subject to any disclaimer, the term of this patent is extended or adjusted under 35 U.S.C. 154(b) by 154 days.

(21) Appl. No.: 15/612,976

(22) Filed: Jun. 2, 2017

(65) Prior Publication Data
US 2018/0349547 A1    Dec. 6, 2018

(51) Int. Cl.
*G06F 17/50* (2006.01)
*G06N 5/04* (2006.01)

(52) U.S. Cl.
CPC ...... *G06F 17/5095* (2013.01); *G06F 17/5009* (2013.01); *G06N 5/04* (2013.01)

(58) Field of Classification Search
CPC ............... G05D 1/0088; G01S 13/931; G01S 2013/9353; G08G 1/166; G06F 17/5095; G06F 17/5009; G06N 5/04
USPC ................................................. 703/6
See application file for complete search history.

(56) References Cited

U.S. PATENT DOCUMENTS

| | | | |
|---|---|---|---|
| 6,777,904 B1 | 8/2004 | Degner | |
| 7,103,460 B1 | 9/2006 | Breed | |
| 7,689,559 B2 | 3/2010 | Canright | |
| 7,783,403 B2 | 8/2010 | Breed | |
| 7,844,595 B2 | 11/2010 | Canright | |
| 8,041,111 B1 | 10/2011 | Wilensky | |

(Continued)

FOREIGN PATENT DOCUMENTS

| | | |
|---|---|---|
| EP | 1754179 A1 | 2/2007 |
| EP | 2448251 A2 | 5/2012 |

(Continued)

OTHER PUBLICATIONS

Shaoshan Liu et al., "Implementing a cloud platform for autonomous driving," Apr. 10, 2017, arXiv.org, eight pages (Year: 2017).*

(Continued)

*Primary Examiner* — Kamini S Shah
(74) *Attorney, Agent, or Firm* — Inventive Law Inc.; Jim H. Salter (57) ABSTRACT

A system and method for large scale distributed simulation for realistic multiple-agent interactive environments are disclosed. A particular embodiment includes: generating a vicinal scenario for each simulated vehicle in an iteration of a simulation, the vicinal scenarios corresponding to different locations, traffic patterns, or environmental conditions being simulated; assigning a processing task to at least one of a plurality of distributed computing devices to generate vehicle trajectories for each of a plurality of simulated vehicles of the simulation based on the vicinal scenario; and updating a state and trajectory of each of the plurality of simulated vehicles based on processed data received from the plurality of distributed computing devices.

20 Claims, 4 Drawing Sheets

(56) References Cited

U.S. PATENT DOCUMENTS

| | | | |
|---|---|---|---|
| 8,064,643 B2 | 11/2011 | Stein | |
| 8,082,101 B2 | 12/2011 | Stein | |
| 8,164,628 B2 | 4/2012 | Stein | |
| 8,175,376 B2 | 5/2012 | Marchesotti | |
| 8,271,871 B2 | 9/2012 | Marchesotti | |
| 8,378,851 B2 | 2/2013 | Stein | |
| 8,392,117 B2 | 3/2013 | Dolgov | |
| 8,401,292 B2 | 3/2013 | Park | |
| 8,412,449 B2 | 4/2013 | Trepagnier | |
| 8,478,072 B2 | 7/2013 | Aisaka | |
| 8,553,088 B2 | 10/2013 | Stein | |
| 8,788,134 B1 | 7/2014 | Litkouhi | |
| 8,908,041 B2 | 12/2014 | Stein | |
| 8,917,169 B2 | 12/2014 | Schofield | |
| 8,963,913 B2 | 2/2015 | Baek | |
| 8,965,621 B1 | 2/2015 | Urmson | |
| 8,981,966 B2 | 3/2015 | Stein | |
| 8,993,951 B2 | 3/2015 | Schofield | |
| 9,002,632 B1 | 4/2015 | Emigh | |
| 9,008,369 B2 | 4/2015 | Schofield | |
| 9,025,880 B2 | 5/2015 | Perazzi | |
| 9,042,648 B2 | 5/2015 | Wang | |
| 9,111,444 B2 | 8/2015 | Kaganovich | |
| 9,117,133 B2 | 8/2015 | Barnes | |
| 9,118,816 B2 | 8/2015 | Stein | |
| 9,120,485 B1 | 9/2015 | Dolgov | |
| 9,122,954 B2 | 9/2015 | Srebnik | |
| 9,134,402 B2 | 9/2015 | Sebastian | |
| 9,145,116 B2 | 9/2015 | Clarke | |
| 9,147,255 B1 | 9/2015 | Zhang | |
| 9,156,473 B2 | 10/2015 | Clarke | |
| 9,176,006 B2 | 11/2015 | Stein | |
| 9,179,072 B2 | 11/2015 | Stein | |
| 9,183,447 B1 | 11/2015 | Gdalyahu | |
| 9,185,360 B2 | 11/2015 | Stein | |
| 9,191,634 B2 | 11/2015 | Schofield | |
| 9,233,659 B2 | 1/2016 | Rosenbaum | |
| 9,233,688 B2 | 1/2016 | Clarke | |
| 9,248,832 B2 | 2/2016 | Huberman | |
| 9,248,835 B2 | 2/2016 | Tanzmeister | |
| 9,251,708 B2 | 2/2016 | Rosenbaum | |
| 9,277,132 B2 | 3/2016 | Berberian | |
| 9,280,711 B2 | 3/2016 | Stein | |
| 9,286,522 B2 | 3/2016 | Stein | |
| 9,297,641 B2 | 3/2016 | Stein | |
| 9,299,004 B2 | 3/2016 | Lin | |
| 9,315,192 B1 | 4/2016 | Zhu | |
| 9,317,033 B2 | 4/2016 | Ibanez-Guzman | |
| 9,317,776 B1 | 4/2016 | Honda | |
| 9,330,334 B2 | 5/2016 | Lin | |
| 9,342,074 B2 | 5/2016 | Dolgov | |
| 9,355,635 B2 | 5/2016 | Gao | |
| 9,365,214 B2 | 6/2016 | Ben Shalom | |
| 9,399,397 B2 | 7/2016 | Mizutani | |
| 9,428,192 B2 | 8/2016 | Schofield | |
| 9,436,880 B2 | 9/2016 | Bos | |
| 9,438,878 B2 | 9/2016 | Niebla | |
| 9,443,163 B2 | 9/2016 | Springer | |
| 9,446,765 B2 | 9/2016 | Ben Shalom | |
| 9,459,515 B2 | 10/2016 | Stein | |
| 9,466,006 B2 | 10/2016 | Duan | |
| 9,476,970 B1 | 10/2016 | Fairfield | |
| 9,490,064 B2 | 11/2016 | Hirosawa | |
| 9,531,966 B2 | 12/2016 | Stein | |
| 9,535,423 B1 | 1/2017 | Debreczeni | |
| 9,555,803 B2 | 1/2017 | Pawlicki | |
| 9,568,915 B1 | 2/2017 | Bemtorp | |
| 9,587,952 B1 | 3/2017 | Slusar | |
| 9,720,418 B2 | 8/2017 | Stenneth | |
| 9,723,097 B2 | 8/2017 | Harris | |
| 9,723,099 B2 | 8/2017 | Chen | |
| 9,738,280 B2 | 8/2017 | Rayes | |
| 9,746,550 B2 | 8/2017 | Nath | |
| 2007/0230792 A1 | 10/2007 | Shashua | |
| 2008/0249667 A1 | 10/2008 | Horvitz | |
| 2009/0040054 A1 | 2/2009 | Wang | |
| 2010/0049397 A1 | 2/2010 | Lin | |
| 2010/0226564 A1 | 9/2010 | Marchesotti | |
| 2010/0281361 A1 | 11/2010 | Marchesotti | |
| 2010/0292886 A1* | 11/2010 | Szczerba | G01C 21/365 701/31.4 |
| 2011/0206282 A1 | 8/2011 | Aisaka | |
| 2012/0105639 A1 | 5/2012 | Stein | |
| 2012/0140076 A1 | 6/2012 | Rosenbaum | |
| 2012/0203528 A1* | 8/2012 | Ikeda | G06F 17/5009 703/8 |
| 2012/0274629 A1 | 11/2012 | Baek | |
| 2014/0145516 A1 | 5/2014 | Hirosawa | |
| 2014/0198184 A1 | 7/2014 | Stein | |
| 2015/0062304 A1 | 3/2015 | Stein | |
| 2015/0353082 A1 | 12/2015 | Lee | |
| 2016/0037064 A1 | 2/2016 | Stein | |
| 2016/0094774 A1 | 3/2016 | Li | |
| 2016/0129907 A1 | 5/2016 | Kim | |
| 2016/0165157 A1 | 6/2016 | Stein | |
| 2016/0210528 A1 | 7/2016 | Duan | |
| 2016/0321381 A1 | 11/2016 | English | |
| 2016/0375907 A1 | 12/2016 | Erban | |

FOREIGN PATENT DOCUMENTS

| | | |
|---|---|---|
| EP | 2463843 A2 | 6/2012 |
| EP | 2463843 A3 | 7/2013 |
| EP | 2761249 A1 | 8/2014 |
| EP | 2463843 B1 | 7/2015 |
| EP | 2448251 A3 | 10/2015 |
| EP | 2946336 A2 | 11/2015 |
| EP | 2993654 A1 | 3/2016 |
| EP | 3081419 A1 | 10/2016 |
| WO | WO/2005/098739 A1 | 10/2005 |
| WO | WO/2005/098751 A1 | 10/2005 |
| WO | WO/2005/098782 | 10/2005 |
| WO | WO/2010/109419 A1 | 9/2010 |
| WO | WO/2013/045612 | 4/2013 |
| WO | WO/2014/111814 A2 | 7/2014 |
| WO | WO/2014/111814 A3 | 7/2014 |
| WO | WO/2014/201324 | 12/2014 |
| WO | WO/2015/083009 | 6/2015 |
| WO | WO/2015/103159 A1 | 7/2015 |
| WO | WO/2015/125022 | 8/2015 |
| WO | WO/2015/186002 A2 | 12/2015 |
| WO | WO/2015/186002 A3 | 12/2015 |
| WO | WO/2016/135736 | 9/2016 |
| WO | WO/2017/013875 A1 | 1/2017 |

OTHER PUBLICATIONS

Sergey Melman et al., "Distributed simulation framework for investigation of autonomous underwater vehicles' real-time behavior," 2015, Oceans 2015 MTS/IEEE Conference, eight pages (Year: 2015).*

O.P. Damani et al., "Fault-tolerant distributed simulation," 1998, Proceedings of the twelfth workshop on Parallel and distributed simulation, eight pages (Year: 1998).*

Eugene Syriani et al., "Modelling and Simulation-Based Design of a Distributed DEVS Simulator," 2011, Proceedings of the 2011 Winter Simulation Conference, 15 pages (Year: 2011).*

J. Sosnowski et al., "Enhancing fault injection testbench," 2006, International Conference on Dependability of Computer Systems, eight pages (Year: 2006).*

Hou, Xiaodi and Zhang, Liqing, "Saliency Detection: A Spectral Residual Approach", Computer Vision and Pattern Recognition, CVPR'07—IEEE Conference, pp. 1-8, 2007.

Hou, Xiaodi and Harel, Jonathan and Koch, Christof, "Image Signature: Highlighting Sparse Salient Regions", IEEE Transactions on Pattern Analysis and Machine Intelligence, vol. 34, No. 1, pp. 194-201, 2012.

Hou, Xiaodi and Zhang, Liqing, "Dynamic Visual Attention: Searching for Coding Length Increments", Advances in geural Information Processing Systems, vol. 21, pp. 681-688, 2008.

(56) References Cited

OTHER PUBLICATIONS

Li, Yin and Hou, Xiaodi and Koch, Christof and Rehg, James M. and Yuille, Alan L., "The Secrets of Salient Object Segmentation", Proceedings of the IEEE Conference on Computer Vision and Pattern Recognition, pp. 280-287, 2014.
Zhou, Bolei and Hou, Xiaodi and Zhang, Liqing, "A Phase Discrepancy Analysis of Object Motion", Asian Conference on Computer Vision, pp. 225-238, Springer Berlin Heidelberg, 2010.
Hou, Xiaodi and Yuille, Alan and Koch, Christof, "Boundary Detection Benchmarking: Beyond F-Measures", Computer Vision and Pattern Recognition, CVPR'13, vol. 2013, pp. 1-8, IEEE, 2013.
Hou, Xiaodi and Zhang, Liqing, "Color Conceptualization", Proceedings of the 15th ACM International Conference on Multimedia, pp. 265-268, ACM, 2007.
Hou, Xiaodi and Zhang, Liqing, "Thumbnail Generation Based on Global Saliency", Advances in Cognitive Neurodynamics, ICCN 2007, pp. 999-1003, Springer Netherlands, 2008.
Hou, Xiaodi and Yuille, Alan and Koch, Christof, "A Meta-Theory of Boundary Detection Benchmarks", arXiv preprint arXiv:1302.5985, 2013.
Li, Yanghao and Wang, Naiyan and Shi, Jianping and Liu, Jiaying and Hou, Xiaodi, "Revisiting Batch Normalization for Practical Domain Adaptation", arXiv preprint arXiv:1603.04779, 2016.
Li, Yanghao and Wang, Naiyan and Liu, Jiaying and Hou, Xiaodi, "Demystifying Neural Style Transfer", arXiv preprint arXiv:1701.01036, 2017.
Hou, Xiaodi and Zhang, Liqing, "A Time-Dependent Model of Information Capacity of Visual Attention", International Conference on Neural Information Processing, pp. 127-136, Springer Berlin Heidelberg, 2006.
Wang, Panqu and Chen, Pengfei and Yuan, Ye and Liu, Ding and Huang, Zehua and Hou, Xiaodi and Cottrell, Garrison, "Understanding Convolution for Semantic Segmentation", arXiv preprint arXiv:1702.08502, 2017.
Li, Yanghao and Wang, Naiyan and Liu, Jiaying and Hou, Xiaodi, "Factorized Bilinear Models for Image Recognition", arXiv preprint arXiv:1611.05709, 2016.
Hou, Xiaodi, "Computational Modeling and Psychophysics in Low and Mid-Level Vision", California Institute of Technology, 2014.
Spinello, Luciano, Triebel, Rudolph, Siegwart, Roland, "Multiclass Multimodal Detection and Tracking in Urban Environments", Sage Journals, vol. 29 issue: 12, pp. 1498-1515 Article first published online: Oct. 7, 2010;Issue published: Oct. 1, 2010.
Matthew Barth, Carrie Malcolm, Theodore Younglove, and Nicole Hill, "Recent Validation Efforts for a Comprehensive Modal Emissions Model", Transportation Research Record 1750, Paper No. 01-0326, College of Engineering, Center for Environmental Research and Technology, University of California, Riverside, CA 92521, date unknown.
Kyoungho Ahn, Hesham Rakha, "The Effects of Route Choice Decisions on Vehicle Energy Consumption and Emissions", Virginia Tech Transportation Institute, Blacksburg, VA 24061, date unknown.
Ramos, Sebastian, Gehrig, Stefan, Pinggera, Peter, Franke, Uwe, Rother, Carsten, "Detecting Unexpected Obstacles for Self-Driving Cars: Fusing Deep Learning and Geometric Modeling", arXiv:1612.06573v1 [cs.CV] Dec. 20, 2016.
Schroff, Florian, Dmitry Kalenichenko, James Philbin, (Google), "FaceNet: A Unified Embedding for Face Recognition and Clustering", CVPR 2015.
Dai, Jifeng, Kaiming He, Jian Sun, (Microsoft Research), "Instance-aware Semantic Segmentation via Multi-task Network Cascades", CVPR 2016.
Huval, Brody, Tao Wang, Sameep Tandon, Jeff Kiske, Will Song, Joel Pazhayampallil, Mykhaylo Andriluka, Pranav Rajpurkar, Toki Migimatsu, Royce Cheng-Yue, Fernando Mujica, Adam Coates, Andrew Y. Ng, "An Empirical Evaluation of Deep Learning on Highway Driving", arXiv:1504.01716v3 [cs.RO] Apr. 17, 2015.
Tian Li, "Proposal Free Instance Segmentation Based on Instance-aware Metric", Department of Computer Science, Cranberry-Lemon University, Pittsburgh, PA., date unknown.
Mohammad Norouzi, David J. Fleet, Ruslan Salakhutdinov, "Hamming Distance Metric Learning", Departments of Computer Science and Statistics, University of Toronto, date unknown.
Jain, Suyong Dutt, Grauman, Kristen, "Active Image Segmentation Propagation", In Proceedings of the IEEE Conference on Computer Vision and Pattern Recognition (CVPR), Las Vegas, Jun. 2016.
MacAodha, Oisin, Campbell, Neill D.F., Kautz, Jan, Brostow, Gabriel J., "Hierarchical Subquery Evaluation for Active Learning on a Graph", In Proceedings of the IEEE Conference on Computer Vision and Pattern Recognition (CVPR), 2014.
Kendall, Alex, Gal, Yarin, "What Uncertainties Do We Need in Bayesian Deep Learning for Computer Vision", arXiv:1703.04977v1 [cs.CV] Mar. 15, 2017.
Wei, Junqing, John M. Dolan, Bakhtiar Litkhouhi, "A Prediction- and Cost Function-Based Algorithm for Robust Autonomous Freeway Driving", 2010 IEEE Intelligent Vehicles Symposium, University of California, San Diego, CA, USA, Jun. 21-24, 2010.
Peter Welinder, Steve Branson, Serge Belongie, Pietro Perona, "The Multidimensional Wisdom of Crowds"; http://www.vision.caltech.edu/visipedia/papers/WelinderEtalNIPS10.pdf, 2010.
Kai Yu, Yang Zhou, Da Li, Zhang Zhang, Kaiqi Huang, "Large-scale Distributed Video Parsing and Evaluation Platform", Center for Research on Intelligent Perception and Computing, Institute of Automation, Chinese Academy of Sciences, China, arXiv:1611.09580v1 [cs.CV] Nov. 29, 2016.
P. Guarneri, G. Rocca and M. Gobbi, "A Neural-Network-Based Model for the Dynamic Simulation of the Tire/Suspension System While Traversing Road Irregularities," in IEEE Transactions on Neural Networks, vol. 19, No. 9, pp. 1549-1563, Sep. 2008.
C. Yang, Z. Li, R. Cui and B. Xu, "Neural Network-Based Motion Control of an Underactuated Wheeled Inverted Pendulum Model," in IEEE Transactions on Neural Networks and Learning Systems, vol. 25, No. 11, pp. 2004-2016, Nov. 2014.
Stephan R. Richter, Vibhav Vineet, Stefan Roth, Vladlen Koltun, "Playing for Data: Ground Truth from Computer Games", Intel Labs, European Conference on Computer Vision (ECCV), Amsterdam, the Netherlands, 2016.
Thanos Athanasiadis, Phivos Mylonas, Yannis Avrithis, and Stefanos Kollias, "Semantic Image Segmentation and Object Labeling", IEEE Transactions on Circuits and Systems for Video Technology, vol. 17, No. 3, Mar. 2007.
Marius Cordts, Mohamed Omran, Sebastian Ramos, Timo Rehfeld, Markus Enzweiler Rodrigo Benenson, Uwe Franke, Stefan Roth, and Bernt Schiele, "The Cityscapes Dataset for Semantic Urban Scene Understanding", Proceedings of the IEEE Computer Society Conference on Computer Vision and Pattern Recognition (CVPR), Las Vegas, Nevada, 2016.
Adhiraj Somani, Nan Ye, David Hsu, and Wee Sun Lee, "DESPOT: Online POMDP Planning with Regularization", Department of Computer Science, National University of Singapore, date unknown.
Adam Paszke, Abhishek Chaurasia, Sangpil Kim, and Eugenio Culurciello. Enet: A deep neural network architecture for real-time semantic segmentation. CoRR, abs/1606.02147, 2016.

* cited by examiner

LARGE SCALE DISTRIBUTED SIMULATION FOR REALISTIC MULTIPLE-AGENT INTERACTIVE ENVIRONMENTS

COPYRIGHT NOTICE

A portion of the disclosure of this patent document contains material that is subject to copyright protection. The copyright owner has no objection to the facsimile reproduction by anyone of the patent document or the patent disclosure, as it appears in the U.S. Patent and Trademark Office patent files or records, but otherwise reserves all copyright rights whatsoever. The following notice applies to the disclosure herein and to the drawings that form a part of this document: Copyright 2016-2017, TuSimple, All Rights Reserved.

TECHNICAL FIELD

This patent document pertains generally to tools (systems, apparatuses, methodologies, computer program products, etc.) for autonomous driving simulation systems, trajectory planning, vehicle control systems, and autonomous driving systems, and more particularly, but not by way of limitation, to a system and method for large scale distributed simulation for realistic multiple-agent interactive environments.

BACKGROUND

Existing methods for representing vehicles in a virtual environment typically involve computer simulations. In a common computer simulation, computers are used to simulate vehicle dynamics using algorithms. The accuracy of computer simulations heavily relies on how well the models are programmed, trained, and validated. Training and validation is often time-consuming and expensive, but necessary to generate high fidelity computer simulations. Even when the computer simulation is thoroughly validated, the computer simulation is still limited as a mathematical representation of reality and is inherently an approximation of the kinematics of the operation of the vehicles being simulated. Such approximations have a tendency to undesirably simplify many of the complexities of the actual system that is being represented. However, such simplifications may be necessary in conventional simulations as the significant processing loads can lengthen response times to unacceptable levels.

Another approach used in conventional simulations is to use historical data collected from a real environment to assist in the creation and training of a virtual environment. However, historical data may be difficult to obtain, may require interaction with environments which may not be available, and may not include enough flexibility to make ad hoc simulations. As a result, traditional methods of representing vehicles in a virtual environment may lack an acceptable level of dynamic accuracy and feasibility.

SUMMARY

A system and method for large scale distributed simulation for realistic multiple-agent interactive environments are disclosed herein. The large scale distributed simulation system described herein can simulate realistic multiple-agent interactive environments with an unlimited quantity of agents in the environment with high fidelity. In a particular embodiment, the agents can represent vehicles or objects being simulated in a virtual environment. Specifically, the system can include a simulation core, handling the physical world simulation processing, and a decision-making process for each of the agents in the simulation, which can be simulated in a distributed fashion. Within the distributed simulation system, each agent's decision-making processing is individually handled by a specific device or a specific process within a device. In this manner, the distributed simulation system can handle an arbitrarily large number of agents operating within the simulated environment. In the various example embodiments described herein, the distributed simulation system can assign the decision-making tasks for a particular agent to one or more specific distributed computing devices or one or more computational processes executing on one or more distributed computing devices. The distributed computing devices and/or the computational processes can operate in parallel to facilitate faster completion of the decision-making tasks for each agent operating in the simulated environment. As a result, the simulated environment can operate in real time with an arbitrarily large number of agents. Thus, the large scale distributed simulation system described herein can simulate realistic multiple-agent interactive environments in real time with a large number of agents. Such a large scale distributed simulation system is well-suited to the simulation of multiple autonomous vehicles operating in a particular location. The highly complex nature of the interactions between the multiple autonomous vehicles as they move within the environment can overwhelm the processing capabilities of traditional simulation systems. The embodiments disclosed herein overcome these problems and limitations of traditional systems by offering a large scale distributed simulation system to handle the intense processing loads.

BRIEF DESCRIPTION OF THE DRAWINGS

The various embodiments are illustrated by way of example, and not by way of limitation, in the figures of the accompanying drawings in which.

DETAILED DESCRIPTION

In the following description, for purposes of explanation, numerous specific details are set forth in order to provide a thorough understanding of the various embodiments. It will be evident, however, to one of ordinary skill in the art that the various embodiments may be practiced without these specific details.

A system and method for large scale distributed simulation for realistic multiple-agent interactive environments are disclosed herein. The large scale distributed simulation system described herein can simulate realistic multiple-agent interactive environments with an unlimited quantity of agents in the environment with high fidelity. In a particular embodiment, the agents can represent vehicles or objects being simulated in a virtual environment. Specifically, the system can include a simulation core, handling the physical world simulation processing, and a decision-making process for each of the agents in the simulation, which can be simulated in a distributed fashion. Within the distributed simulation system, each agent's decision-making processing is individually handled by a specific device or a specific process within a device. In this manner, the distributed simulation system can handle an arbitrarily large number of agents operating within the simulated environment. In the various example embodiments described herein, the distributed simulation system can assign the decision-making tasks for a particular agent to one or more specific distributed computing devices or one or more computational processes executing on one or more distributed computing devices. The distributed computing devices and/or the computational processes can operate in parallel to facilitate faster completion of the decision-making tasks for each agent operating in the simulated environment. As a result, the simulated environment can operate in real time with an arbitrarily large number of agents. Thus, the large scale distributed simulation system described herein can simulate realistic multiple-agent interactive environments in real time with a large number of agents. Such a large scale distributed simulation system is well-suited to the simulation of multiple autonomous vehicles operating in a particular location. The highly complex nature of the interactions between the multiple autonomous vehicles as they move within the environment can overwhelm the processing capabilities of traditional simulation systems. The embodiments disclosed herein overcome these problems and limitations of traditional systems by offering a large scale distributed simulation system to handle the intense processing loads.

Figure 1:
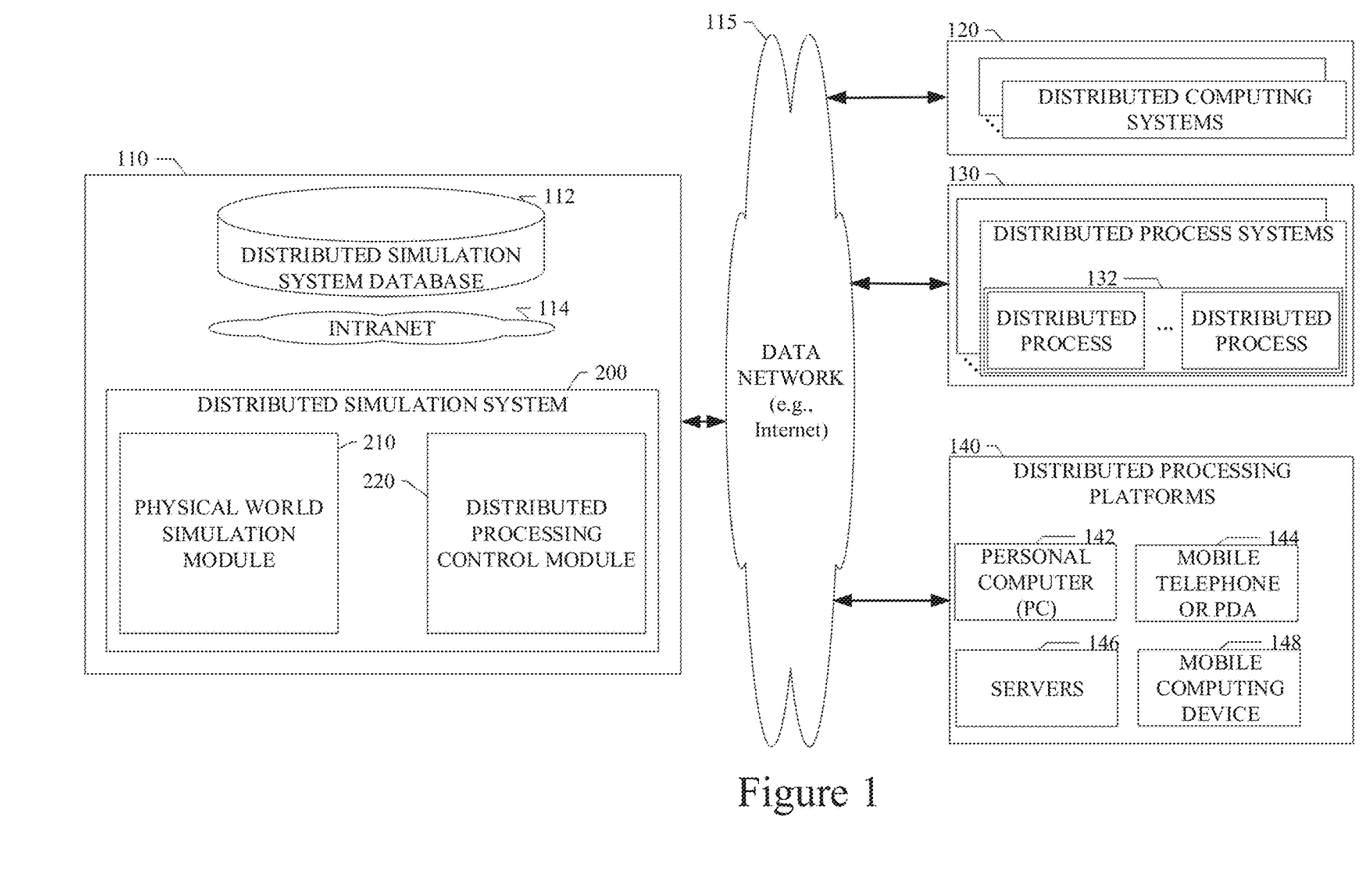
FIG. 1 illustrates an example embodiment of a networked system in which various embodiments may operate.

As described in various example embodiments, a system and method for large scale distributed simulation for realistic multiple-agent interactive environments are described herein. Referring to FIG. 1, an example embodiment disclosed herein can be implemented as an application or service, typically provided by or operating on a server or host site 110. The host site 110 is provided to simplify and facilitate the hosted use of the distributed simulation system 200 of an example embodiment. In a particular embodiment, the distributed simulation system 200 can be hosted by the host site 110 and used with a plurality of distributed computing devices via a data network 115, such as the Internet. The distributed computing devices can include a plurality of distributed computing systems 120, a plurality of distributed process systems 130, and/or a plurality of distributed processing platforms 140. The distributed computing devices can also include directly connected (e.g., non-networked) computing devices. The details of the distributed simulation system 200 of an example embodiment are provided below.

Referring again to FIG. 1, the distributed simulation system 200 can be in network data communication with a plurality of distributed computing systems 120, a plurality of distributed process systems 130, and/or a plurality of distributed processing platforms 140. The distributed computing systems 120 can include computing systems, data processors, or other network resources at which data processing for a particular autonomous vehicle or simulated vehicle can be performed. In particular, the data processing for a particular vehicle in a simulation can include the decision-making processing needed for the particular vehicle, such as route planning or selection, collision avoidance, trajectory calculation, navigation, and the like. The distributed computing systems 120 can represent computing systems, data processors, or other network resources at which the processing systems 120 are each wholly dedicated to the computing requirements for a different single vehicle in simulation. The distributed process systems 130 can also include computing systems, data processors, or other network resources at which data processing for particular autonomous vehicles or simulated vehicles can be performed. The distributed process systems 130 can also provide the decision-making processing needed for vehicles in simulation. However, unlike the distributed computing systems 120, the distributed process systems 130 can service the decision-making processing for multiple simulated vehicles. Each of the plurality of distributed process systems 130 can include a plurality of distributed processes 132, each of which can be wholly dedicated to the computing requirements for a different single vehicle in simulation. Thus, the distributed process systems 130, with multiple distributed processes 132 therein, can service multiple simulated vehicles. The plurality of distributed processing platforms 140 represent the variety of different types of processing platforms at which the decision-making processing for multiple simulated vehicles can be performed. Any of the distributed computing systems 120 or the distributed process systems 130 can be implemented on any one of the distributed processing platforms 140.

In various embodiments, the distributed processing platforms 140 with one or more distributed computing devices executing therein enable the distributed simulation system 200 to assign simulated vehicle decision-making processing tasks to one or more distributed computing devices of distributed computing systems 120, distributed process systems 130, or distributed processing platforms 140 via the host 110 and network 115. The distributed computing devices of distributed computing systems 120, distributed process systems 130, or distributed processing platforms 140 may include virtually any computing device that is configured to process data and send and receive information over a network, such as network 115. Such distributed computing devices may include portable devices 144, such as, cellular telephones, smart phones, radio frequency (RF) devices, infrared (IR) devices, global positioning devices (GPS), Personal Digital Assistants (PDAs), handheld computers, wearable computers, tablet computers, integrated devices combining one or more of the preceding devices, and the like. The distributed computing devices may also include other computing devices, such as personal computers 142, multiprocessor systems, mainframe computers, servers 146, microprocessor-based or programmable computing systems, network PC's, and the like. The distributed computing devices may also include other processing devices, such as mobile computing devices 148, which are known to those of ordinary skill in the art. As such, the distributed computing devices of distributed processing platform 140 may range widely in terms of capabilities and features. Moreover, the distributed computing devices may include a browser application enabled to receive and to send wireless application protocol messages (WAP), and/or wired application messages, and the like. In one embodiment, the browser application is enabled to employ HyperText Markup Language (HTML), Dynamic HTML, Handheld Device Markup Language (HDML), Wireless Markup Language (WML), WMLScript, JavaScript™, EXtensible HTML (xHTML), Compact HTML (CHTML), and the like, to display and/or send digital information. In other embodiments, mobile devices can be configured with applications (apps) with which the functionality described herein can be implemented.

The distributed computing devices of distributed processing platform 140 may also include at least one application that is configured to receive vehicle simulation data and/or control data from another computing device via a wired or wireless network transmission. The application may include a capability to provide and receive textual data, graphical data, video data, audio data, and the like. Moreover, distributed computing devices of distributed processing platform 140 may be further configured to communicate and/or receive a message, such as through a Short Message Service (SMS), direct messaging (e.g., Twitter™), email, Multimedia Message Service (MMS), instant messaging (IM), internet relay chat (IRC), mIRC, Jabber, Enhanced Messaging Service (EMS), text messaging, Smart Messaging, Over the Air (OTA) messaging, or the like, between another computing device, and the like.

One or more of the distributed computing systems 120, the distributed process systems 130, and the distributed processing platform 140 can be provided by one or more third party providers operating at various locations in a network ecosystem. It will be apparent to those of ordinary skill in the art that distributed computing systems 120 or distributed process systems 130 can be any of a variety of networked third party data processing systems. In a particular embodiment, a resource list maintained at the host site 110 can be used as a summary or list of all distributed computing systems 120, distributed process systems 130, and distributed processing platforms 140, which the host site 110 may use to process vehicle simulation data. The host site 110, distributed computing systems 120, distributed process systems 130, and distributed processing platforms 140 may communicate and transfer data and information in the data network ecosystem shown in FIG. 1 via a wide area data network (e.g., the Internet) 115. Various components of the host site 110 can also communicate internally via a conventional intranet or local area network (LAN) 114.

Networks 115 and 114 are configured to couple one computing device with another computing device. Networks 115 and 114 may be enabled to employ any form of computer readable media for communicating information from one electronic device to another. Network 115 can include the Internet in addition to LAN 114, wide area networks (WANs), direct connections, such as through a universal serial bus (USB) port, other forms of computer-readable media, or any combination thereof. On an interconnected set of LANs, including those based on differing architectures and protocols, a router and/or gateway device acts as a link between LANs, enabling messages to be sent between computing devices. Also, communication links within LANs typically include twisted wire pair or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links including satellite links, or other communication links known to those of ordinary skill in the art. Furthermore, remote computers and other related electronic devices can be remotely connected to either LANs or WANs via a wireless link, WiFi, Bluetooth™, satellite, or modem and temporary telephone link.

Networks 115 and 114 may further include any of a variety of wireless sub-networks that may further overlay stand-alone ad-hoc networks, and the like, to provide an infrastructure-oriented connection. Such sub-networks may include mesh networks, Wireless LAN (WLAN) networks, cellular networks, and the like. Networks 115 and 114 may also include an autonomous system of terminals, gateways, routers, and the like connected by wireless radio links or wireless transceivers. These connectors may be configured to move freely and randomly and organize themselves arbitrarily, such that the topology of networks 115 and 114 may change rapidly and arbitrarily.

Networks 115 and 114 may further employ a plurality of access technologies including 2nd (2G), 2.5, 3rd (3G), 4th (4G) generation radio access for cellular systems, WLAN, Wireless Router (WR) mesh, and the like. Access technologies such as 2G, 3G, 4G, and future access networks may enable wide area coverage for mobile devices, such as one or more of distributed computing devices 140, with various degrees of mobility. For example, networks 115 and 114 may enable a radio connection through a radio network access such as Global System for Mobile communication (GSM), General Packet Radio Services (GPRS), Enhanced Data GSM Environment (EDGE), Wideband Code Division Multiple Access (WCDMA), CDMA2000, and the like. Networks 115 and 114 may also be constructed for use with various other wired and wireless communication protocols, including TCP/IP, UDP, SIP, SMS, RTP, WAP, CDMA, TDMA, EDGE, UMTS, GPRS, GSM, UWB, WiFi, WiMax, IEEE 802.11x, and the like. In essence, networks 115 and 114 may include virtually any wired and/or wireless communication mechanisms by which information may travel between one computing device and another computing device, network, and the like. In one embodiment, network 114 may represent a LAN that is configured behind a firewall (not shown), within a business data center, for example.

The distributed computing systems 120, distributed process systems 130, and/or the distributed processing platforms 140 may communicate on network 115 via any of a variety of types of network transportable digital data. The network transportable digital data can be transported in any of a family of file formats and associated mechanisms usable to enable a host site 110 and a distributed processing platform 140 to receive vehicle simulation data over the network 115. Any electronic file format and any data interchange format defined by specific sites can be supported by the various embodiments described herein.

Referring again to FIG. 1, the distributed simulation system 200 of an example embodiment is shown to include distributed simulation system database 112. The database 112 can be used to retain a variety of information data sets including, but not limited to, vehicle simulation data, routing data, trajectories, and the like. It will be apparent to those of ordinary skill in the art that the distributed simulation system database 112 can be locally resident at the host site 110 or remotely located at other server locations or stored in network cloud storage.

Referring again to FIG. 1, host site 110 of an example embodiment is shown to include the distributed simulation system 200. In an example embodiment, distributed simulation system 200 can include a physical world simulation module 210 and a distributed processing control module 220. Each of these modules can be implemented as software components executing within an executable environment of distributed simulation system 200 operating on host site 110. Each of these modules of an example embodiment is described in more detail below in connection with the figures provided herein.

Referring still to FIG. 1, the distributed simulation system 200 can include a physical world simulation module 210. The physical world simulation module 210 can be configured to perform the processing as described herein. Initially, the physical world simulation module 210 can be configured to generate a simulated virtual environment 300 (see FIG. 2), which typically models an actual physical location in the real world. A real world data collection system can be used to capture high definition image data and other sensor data at various actual physical locations in the real world. The real world data collection system can include an array of information gathering devices or sensors that may include image generating devices (e.g., cameras), light amplification by stimulated emission of radiation (laser) devices, light detection and ranging (LIDAR) devices, global positioning system (GPS) devices, sound navigation and ranging (sonar) devices, radio detection and ranging (radar) devices, and the like. The information gathered by the information gathering devices at various traffic locations can include traffic or vehicle image data, roadway data, environmental data, distance data from LIDAR or radar devices, and other sensor information received from the information gathering devices of the real world data collection system positioned adjacent to particular roadways (e.g., monitored locations). Additionally, the real world data collection system can include information gathering devices installed in moving test vehicles being navigated through pre-defined routings in an environment or location of interest.

Figure 2:
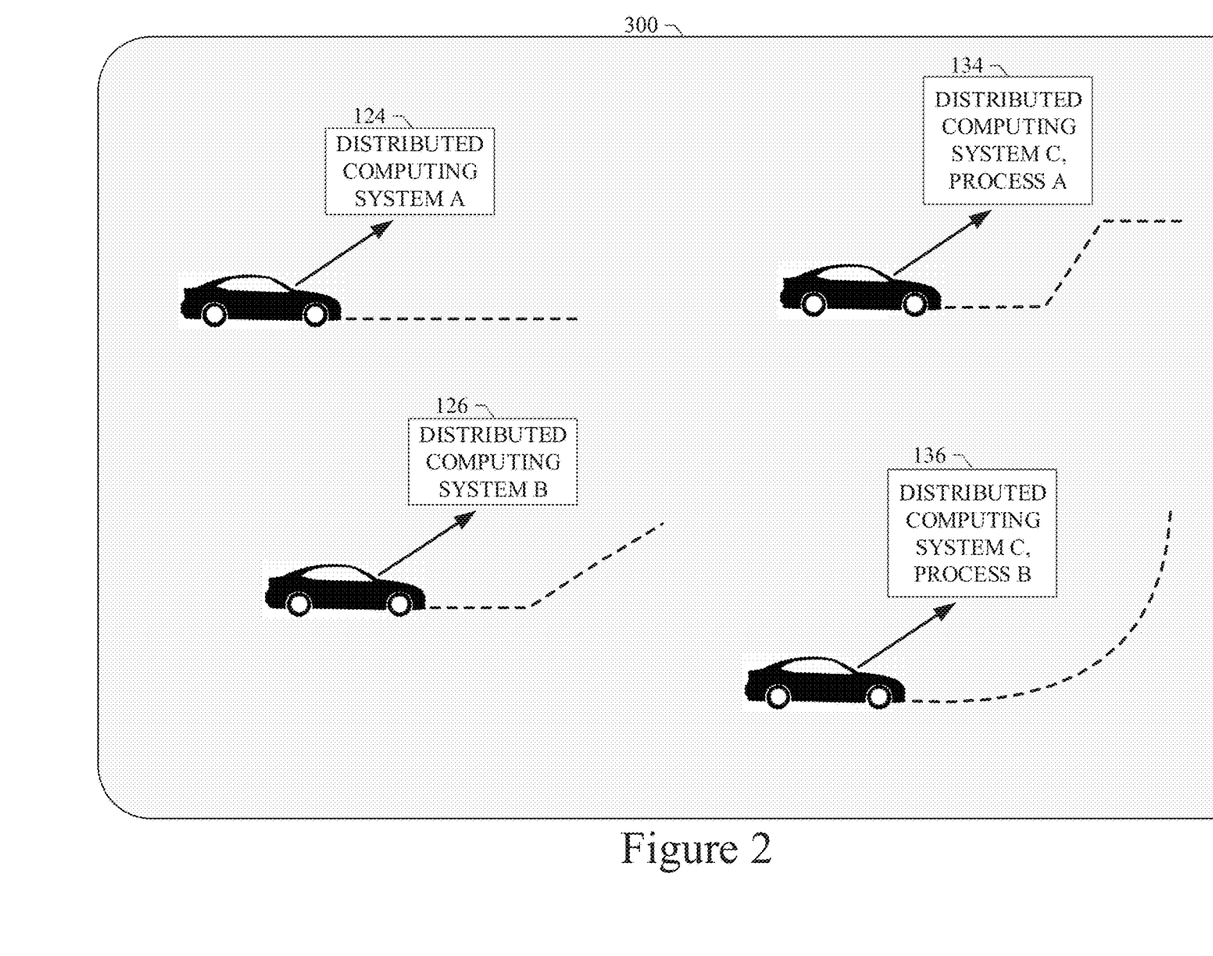
FIG. 2 illustrates an example embodiment of a virtual simulation environment in which the decision making tasks for multiple agents in the virtual environment are handled by multiple distributed computing devices and distributed processes.

The physical world simulation module 210 of the distributed simulation system 200 can perform filtering, object segmentation, object classification, and other image processing functions to isolate vehicle or object presence and activity in the images and sensor data received from a real world data collection system. The physical world simulation module 210 can use the data provided by the real world data collection system and related real world vehicle or object scenarios to create a platform for corresponding simulations of vehicle or object trajectories in the particular virtual environment 300.

In an example embodiment, the physical world simulation module 210 can include a vicinal scene data generator module that serves to generate a vicinal scenario for each simulated vehicle in the virtual environment 300. The different vicinal scenarios can correspond to different locations, different traffic patterns, different environmental conditions, and the like. The vicinal scenarios can be represented, for example, by an occupancy grid, a collection of vehicle states on a map, or a graphical representation, such as a top-down image of one or more areas of interest. The vicinal scenarios can also correspond to a particular set of conditions in which the simulated vehicle is operating. For example, the vicinal scenario can include the simulated location of the simulated vehicle, the simulated road and traffic conditions, the environmental conditions, the vehicle and occupant status, and the like. The vicinal scenario can be used to vary the simulated conditions across a wide variety of different kinds of circumstances typical in the real world. The vicinal scene data generator module can use the data provided by the real world data collection system to configure the particular vicinal scenarios. The vicinal scenario data generated by the vicinal scene data generator module for a particular iteration of the simulation can be passed to the distributed processing control module 220 as shown in FIG. 1 and described in more detail below.

Referring still to FIG. 1, the distributed simulation system 200 can include a distributed processing control module 220. The distributed processing control module 220 can be configured to perform the processing as described herein. FIG. 2 illustrates an example embodiment of a virtual simulation environment 300 in which the decision making tasks for multiple agents in the virtual environment 300 are handled by multiple distributed computing devices and distributed processes. The physical world simulation module 210 can use the data provided by the real world data collection system and related real world vehicle or object scenarios to create the virtual simulation environment 300. As shown in FIG. 2, each vehicle or moving object being simulated by the distributed simulation system 200 in the virtual environment 300 can operate or move in a variety of ways. The distributed simulation system 200 simulates the vehicle operations and movements by generating corresponding simulations of vehicle or object trajectories in the particular virtual environment 300. In most cases, the distributed simulation system 200 attempts to simulate the expected driver behaviors and typical vehicle trajectories that would be experienced in a real world environment. As a result, there is a significant amount of information processing and decision making to perform for each vehicle or object being simulated by the distributed simulation system 200 in the virtual environment 300. If the data processor in the host server 110 were to handle all of this information processing and decision making itself for each of the vehicles and objects being simulated, the distributed simulation system 200 would ultimately experience unacceptable levels of latency and delay.

To solve this problem, the distributed processing control module 220 is provided in the example embodiment to delegate or assign data processing operations or tasks to the distributed computing devices, including the plurality of distributed computing systems 120, the plurality of distributed process systems 130, and/or the plurality of distributed processing platforms 140 as described above. In a typical implementation, the processing operations or tasks for a particular vehicle or object in the simulation of environment 300 are assigned to a single processing system of distributed computing systems 120, a single process of the plurality of distributed process systems 130, or a single distributed processing device of the plurality of distributed processing platforms 140. For example, as shown in FIG. 2, the decision making tasks, trajectory calculations, or other processing for a first vehicle in the virtual environment 300 can be assigned by the distributed processing control module 220 to a distributed computing system A 124, which is a computing system separate and independent from the distributed simulation system 200. The distributed computing system A 124 can perform the processing tasks for the first vehicle in simulation and return results to the distributed processing control module 220. Similarly, as shown in FIG. 2, the decision making tasks, trajectory calculations, or other processing for a second vehicle in the virtual environment 300 can be assigned by the distributed processing control module 220 to a distributed computing system B 126, which is also a computing system separate and independent from the distributed simulation system 200. The distributed computing system B 126 can perform the processing tasks for the second vehicle in simulation and return results to the distributed processing control module 220. Similarly, as shown in FIG. 2, the decision making tasks, trajectory calculations, or other processing for a third vehicle in the virtual environment 300 can be assigned by the distributed processing control module 220 to a distributed computing system C, which is also a computing system separate and independent from the distributed simulation system 200. The distributed computing system C can include an executable process A 134, which can perform the processing tasks for the third vehicle in simulation and return results to the distributed processing control module 220. Finally, as also shown in FIG. 2, the decision making tasks, trajectory calculations, or other processing for a fourth vehicle in the virtual environment 300 can be assigned by the distributed processing control module 220 to the same distributed computing system C, which is separate and independent from the distributed simulation system 200. The distributed computing system C can also include another executable process B 136, different from executable process A 134, which can perform the processing tasks for the fourth vehicle in simulation and return results to the distributed processing control module 220. In other implementations, other partitioning of the processing workload can be assigned to the distributed computing devices. The distributed processing control module 220 can maintain a record of the assignment of particular processing tasks to the particular distributed computing devices handling the assigned tasks. The distributed processing control module 220 can also maintain a record of the time of the assignment and the status of the assignment. Upon completion of a particular processing task, the various distributed computing devices can respond to the distributed processing control module 220 with a result for the assigned processing task. The distributed processing control module 220 can pass the results to the distributed simulation system 200 for integration into the simulation. The distributed processing control module 220 can then assign a new processing task to the distributed processing device. If no result or response is received within a pre-defined time window from a distributed processing device to which a processing task was assigned, the distributed processing control module 220 can record the particular distributed processing device as non-responsive or inactive and can assign the processing task to another distributed processing device. In this manner, the distributed processing control module 220 can dispatch and manage the distribution of processing tasks to an arbitrary number of distributed computing devices for the data processing needs of the simulation being executed by the distributed simulation system 200. Thus, the distributed simulation system 200 can handle an arbitrarily large number of simulated vehicles or objects in the simulation by virtue of the processing performed by the plurality of distributed computing devices.

As a result of the processing performed by the distributed computing devices, data corresponding to predicted or simulated driver behaviors and predicted or simulated vehicle trajectories can be produced by an array of distributed computing devices for each simulated vehicle or object. The simulated driver behaviors and vehicle trajectories can be fed back into the distributed simulation system 200 to implement the simulation and to improve the accuracy of the predicted trajectories. Ultimately, the distributed simulation system 200 can be used to provide highly accurate predicted traffic trajectory information to a user or for configuration of a control system of an autonomous vehicle. In particular, the predicted or simulated traffic trajectory information can be used by the distributed simulation system 200 to create the virtual environment 300 where a control system for an autonomous vehicle can be trained and improved. The virtual environment 300 can be configured to be identical (as possible) to the real world where vehicles are operated by human drivers. In other words, the predicted or simulated traffic trajectory information generated by the distributed simulation system 200 is indirectly useful for configuring the control systems for an autonomous vehicle. It will be apparent to those of ordinary skill in the art that the distributed simulation system 200 and the predicted or simulated traffic trajectory information described and claimed herein can be implemented, configured, processed, and used in a variety of other applications and systems as well.

In an example embodiment, the distributed simulation system 200, by use of the plurality of distributed computing devices, can be configured to enable the generation of predicted vehicle trajectories for each of a plurality of simulated vehicles of the simulation based on a particular vicinal scenario dataset configured by the vicinal scene data generator module, described above, along with corresponding vehicle intention data. In one example, the distributed simulation system 200, by use of the plurality of distributed computing devices, may simulate the typical and atypical driver behaviors, such as steering or heading control, speed or throttle control, and stopping or brake control. In one example, the plurality of distributed computing devices may use, for example, sensory-motor transport delay, dynamic capabilities, and preferred driving behaviors. In some implementations, the plurality of distributed computing devices may include modeling of the transport time delay between a stimulus and the simulated driver's control response. In some implementations, this delay may represent the time necessary for the driver to sense a stimulus, process it, determine the best corrective action, and respond. The plurality of distributed computing devices may also include a speed control model with an absolute maximum vehicle speed (e.g., the maximum speed of the vehicle, the speed a driver is not comfortable exceeding, etc.) and a cornering aggressiveness measure to reduce the speed based on the turning radius. In the example, this may replicate the tendency of drivers to slow down through a turn. In the example, once the turning radius drops below the cornering threshold in the scenario, the speed may be reduced in proportion to the tightness of the turn.

A data storage device or distributed simulation system database 112 is also provided with the distributed simulation system 200 of an example embodiment. The distributed simulation system database 112 can be implemented with standard data storage devices (e.g., flash memory, DRAM, SIM cards, or the like) or as cloud storage in a networked server. In an example embodiment, the distributed simulation system database 112 can be used to store information related to the virtual environment 300, information related to the trajectories and status of the vehicles and objects being simulated in the environment 300, and a set of vehicle intention data. The vehicle intention data can correspond to a data representation of various types of simulated vehicle and/or driver intentions. The simulated vehicle and/or driver intentions can correspond to a driver's short term driving goals, such as merging to a ramp, making right turn at an intersection, making a U-turn, and the like. The simulated vehicle and/or driver intentions can also correspond to a set of driver or vehicle control actions to accomplish a particular short term driving goal. The simulated vehicle and/or driver intentions for a variety of different vehicle actions and behaviors can be stored in the distributed simulation system database 112 as vehicle intention data. In a particular embodiment, the vicinal scene data generator module can select a particular set of the vehicle intention data to be processed for an iteration of the simulation. In another embodiment, the particular set of the vehicle intention data can be pre-determined prior to the execution of the simulation. For each iteration of the simulation, the vehicle intention data can be passed to one or more of the plurality of distributed computing devices so the behavior and trajectory of each simulated vehicle can be computed by a corresponding distributed processing device.

Figure 3:
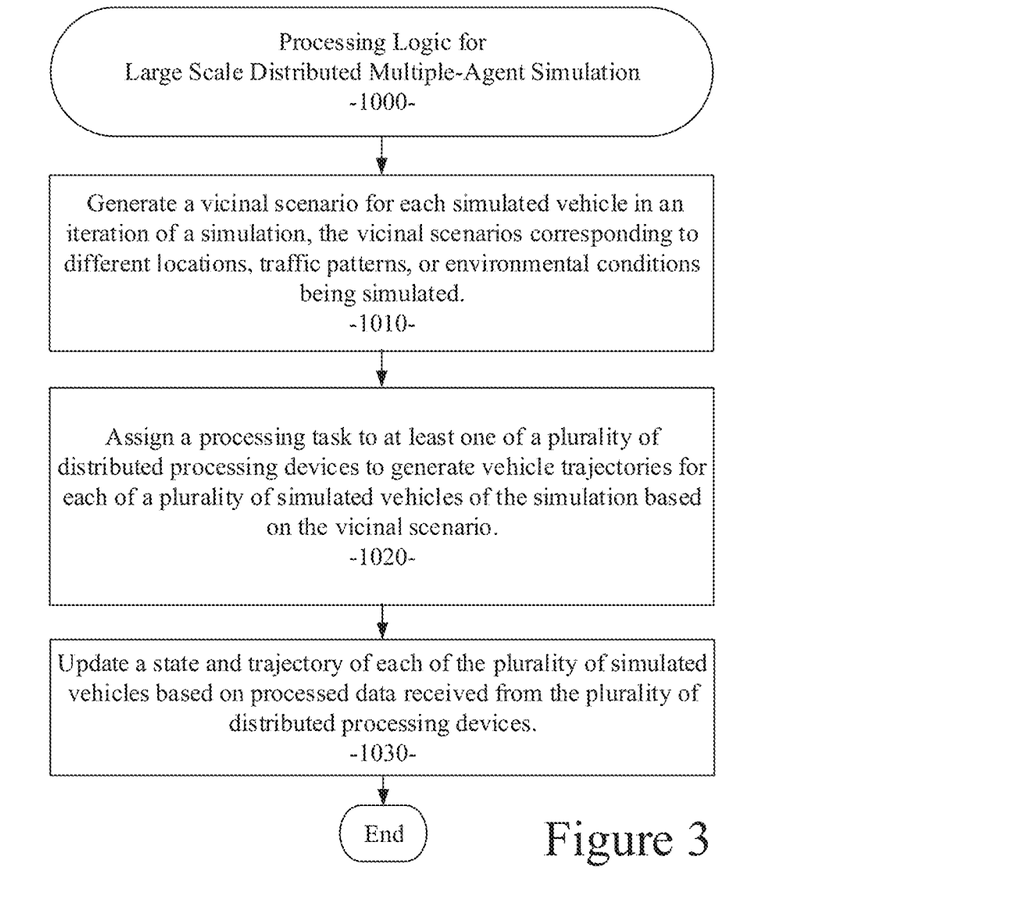
FIG. 3 is a process flow diagram illustrating an example embodiment of a system and method for large scale distributed simulation for realistic multiple-agent interactive environments.

Referring now to FIG. 3, a flow diagram illustrates an example embodiment of a system and method 1000 for large scale distributed multiple-agent simulation. The example embodiment can be configured for: generating a vicinal scenario for each simulated vehicle in an iteration of a simulation, the vicinal scenarios corresponding to different locations, traffic patterns, or environmental conditions being simulated (processing block 1010); assigning a processing task to at least one of a plurality of distributed computing devices to generate vehicle trajectories for each of a plurality of simulated vehicles of the simulation based on the vicinal scenario (processing block 1020); and updating a state and trajectory of each of the plurality of simulated vehicles based on processed data received from the plurality of distributed computing devices (processing block 1030).

Figure 4:
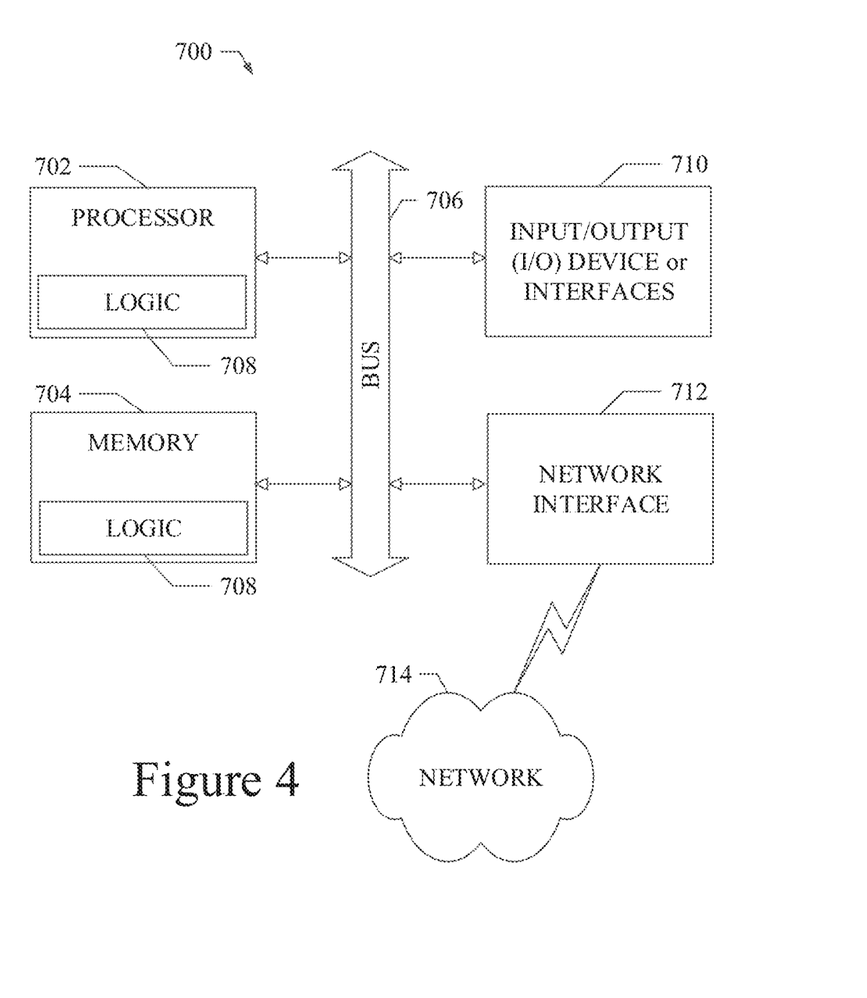
FIG. 4 shows a diagrammatic representation of machine in the example form of a computer system within which a set of instructions when executed may cause the machine to perform any one or more of the methodologies discussed herein.

FIG. 4 shows a diagrammatic representation of a machine in the example form of a computing system 700 within which a set of instructions when executed and/or processing logic when activated may cause the machine to perform any one or more of the methodologies described and/or claimed herein. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a laptop computer, a tablet computing system, a Personal Digital Assistant (PDA), a cellular telephone, a smartphone, a web appliance, a set-top box (STB), a network router, switch or bridge, or any machine capable of executing a set of instructions (sequential or otherwise) or activating processing logic that specify actions to be taken by that machine. Further, while only a single machine is illustrated, the term "machine" can also be taken to include any collection of machines that individually or jointly execute a set (or multiple sets) of instructions or processing logic to perform any one or more of the methodologies described and/or claimed herein.

The example computing system 700 can include a data processor 702 (e.g., a System-on-a-Chip (SoC), general processing core, graphics core, and optionally other processing logic) and a memory 704, which can communicate with each other via a bus or other data transfer system 706. The mobile computing and/or communication system 700 may further include various input/output (I/O) devices and/or interfaces 710, such as a touchscreen display, an audio jack, a voice interface, and optionally a network interface 712. In an example embodiment, the network interface 712 can include one or more radio transceivers configured for compatibility with any one or more standard wireless and/or cellular protocols or access technologies (e.g., 2nd (2G), 2.5, 3rd (3G), 4th (4G) generation, and future generation radio access for cellular systems, Global System for Mobile communication (GSM), General Packet Radio Services (GPRS), Enhanced Data GSM Environment (EDGE), Wideband Code Division Multiple Access (WCDMA), LTE, CDMA2000, WLAN, Wireless Router (WR) mesh, and the like). Network interface 712 may also be configured for use with various other wired and/or wireless communication protocols, including TCP/IP, UDP, SIP, SMS, RTP, WAP, CDMA, TDMA, UMTS, UWB, WiFi, WiMax, Bluetooth™, IEEE 802.11x, and the like. In essence, network interface 712 may include or support virtually any wired and/or wireless communication and data processing mechanisms by which information/data may travel between a computing system 700 and another computing or communication system via network 714.

The memory 704 can represent a machine-readable medium on which is stored one or more sets of instructions, software, firmware, or other processing logic (e.g., logic 708) embodying any one or more of the methodologies or functions described and/or claimed herein. The logic 708, or a portion thereof, may also reside, completely or at least partially within the processor 702 during execution thereof by the mobile computing and/or communication system 700. As such, the memory 704 and the processor 702 may also constitute machine-readable media. The logic 708, or a portion thereof, may also be configured as processing logic or logic, at least a portion of which is partially implemented in hardware. The logic 708, or a portion thereof, may further be transmitted or received over a network 714 via the network interface 712. While the machine-readable medium of an example embodiment can be a single medium, the term "machine-readable medium" should be taken to include a single non-transitory medium or multiple non-transitory media (e.g., a centralized or distributed database, and/or associated caches and computing systems) that store the one or more sets of instructions. The term "machine-readable medium" can also be taken to include any non-transitory medium that is capable of storing, encoding or carrying a set of instructions for execution by the machine and that cause the machine to perform any one or more of the methodologies of the various embodiments, or that is capable of storing, encoding or carrying data structures utilized by or associated with such a set of instructions. The term "machine-readable medium" can accordingly be taken to include, but not be limited to, solid-state memories, optical media, and magnetic media.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system comprising:
   a data processor;
   a plurality of distributed computing devices in data communication with the data processor via a data network; and
   a distributed multiple-agent simulation module, executable by the data processor, the distributed multiple-agent simulation module being configured to perform a distributed multiple-agent simulation operation for autonomous vehicle simulation, the distributed multiple-agent simulation operation being configured to:
      generate a vicinal scenario for each simulated vehicle in an iteration of a simulation, the vicinal scenarios corresponding to different locations, traffic patterns, or environmental conditions being simulated;
      assign, by use of the data network, a processing task to each of the plurality of distributed computing devices to cause each of the distributed computing devices to use their own computing resources to generate vehicle trajectories and data corresponding to simulated vehicle or driver behaviors for each of a plurality of simulated vehicles of the simulation based on the vicinal scenario and the assigned processing tasks;

receive via the data network from each of the distributed computing devices processed data including vehicle trajectories and data corresponding to simulated vehicle or driver behaviors for each of the plurality of simulated vehicles;

manage the processing tasks assigned and processed data received from each of the distributed computing devices, the managing including recording a particular distributed computing device as non-responsive or inactive when data from the particular distributed computing device is not received within a pre-defined time window and re-assigning the processing task originally assigned to the non-responsive distributed computing device to another distributed computing device; and update a state and trajectory of each of the plurality of simulated vehicles based on the processed data received from the plurality of distributed computing devices.

2. The system of claim 1 wherein the plurality of distributed computing devices includes a plurality of distributed computing systems and a plurality of distributed process systems.

3. The system of claim 1 wherein the plurality of distributed computing devices includes a plurality of distributed computing systems, wherein each distributed computing system is wholly dedicated to the computing requirements for a different single vehicle in simulation.

4. The system of claim 1 wherein the plurality of distributed computing devices includes a plurality of distributed process systems, each having a plurality of distributed processes, wherein each distributed process is wholly dedicated to the computing requirements for a different single vehicle in simulation.

5. The system of claim 1 wherein the distributed multiple-agent simulation operation is performed over multiple iterations.

6. The system of claim 1 wherein the distributed multiple-agent simulation operation being further configured to receive an array of sensor information gathered at various traffic locations by a real world data collection system.

7. The system of claim 1 wherein the distributed multiple-agent simulation operation being further configured to provide predicted traffic trajectory information for configuring a control system in an autonomous vehicle.

8. A method comprising:
interfacing with a plurality of distributed computing devices in data communication with a data processor via a data network;

generating, by use of the data processor, a vicinal scenario for each simulated vehicle in an iteration of a simulation, the vicinal scenarios corresponding to different locations, traffic patterns, or environmental conditions being simulated;

assigning, by use of the data processor and the data network, a processing task to each of the plurality of distributed computing devices to cause each of the distributed computing devices to use their own computing resources to generate vehicle trajectories and data corresponding to simulated vehicle or driver behaviors for each of a plurality of simulated vehicles of the simulation based on the vicinal scenario and the assigned processing tasks;

receiving via the data network from each of the distributed computing devices processed data including vehicle trajectories and data corresponding to simulated vehicle or driver behaviors for each of the plurality of simulated vehicles;

managing the processing tasks assigned and processed data received from each of the distributed computing devices, the managing including recording a particular distributed computing device as non-responsive or inactive when data from the particular distributed computing device is not received within a pre-defined time window and re-assigning the processing task originally assigned to the non-responsive distributed computing device to another distributed computing device; and updating a state and trajectory of each of the plurality of simulated vehicles based on the processed data received from the plurality of distributed computing devices.

9. The method of claim 8 wherein the plurality of distributed computing devices includes a plurality of distributed computing systems and a plurality of distributed process systems.

10. The method of claim 8 wherein the plurality of distributed computing devices includes a plurality of distributed computing systems, wherein each distributed computing system is wholly dedicated to the computing requirements for a different single vehicle in simulation.

11. The method of claim 8 wherein the plurality of distributed computing devices includes a plurality of distributed process systems, each having a plurality of distributed processes, wherein each distributed process is wholly dedicated to the computing requirements for a different single vehicle in simulation.

12. The method of claim 8 wherein the method is performed over multiple iterations.

13. The method of claim 8 including receiving an array of sensor information gathered at various traffic locations by a real world data collection system.

14. The method of claim 8 including providing predicted traffic trajectory information for configuring a control system in an autonomous vehicle.

15. A non-transitory machine-useable storage medium embodying instructions which, when executed by a machine, cause the machine to:

interface with a plurality of distributed computing devices in data communication with a data processor via a data network;

generate, by use of the data processor, a vicinal scenario for each simulated vehicle in an iteration of a simulation, the vicinal scenarios corresponding to different locations, traffic patterns, or environmental conditions being simulated;

assign, by use of the data processor, a processing task to each of the plurality of distributed computing devices to cause each of the distributed computing devices to use their own computing resources to generate vehicle trajectories and data corresponding to simulated vehicle or driver behaviors for each of a plurality of simulated vehicles of the simulation based on the vicinal scenario and the assigned processing tasks;

receive via the data network from each of the distributed computing devices processed data including vehicle trajectories and data corresponding to simulated vehicle or driver behaviors for each of the plurality of simulated vehicles;

manage the processing tasks assigned and processed data received from each of the distributed computing devices, the managing including recording a particular distributed computing device as non-responsive or inactive when data from the particular distributed computing device is not received within a pre-defined time window and re-assigning the processing task originally assigned to the non-responsive distributed computing device to another distributed computing device; and update a state and trajectory of each of the plurality of simulated vehicles based on the processed data received from the plurality of distributed computing devices.

16. The machine-useable storage medium of claim 15 wherein the plurality of distributed computing devices includes a plurality of distributed computing systems and a plurality of distributed process systems.

17. The machine-useable storage medium of claim 15 wherein the plurality of distributed computing devices includes a plurality of distributed computing systems, wherein each distributed computing system is wholly dedicated to the computing requirements for a different single vehicle in simulation.

18. The machine-useable storage medium of claim 15 wherein the plurality of distributed computing devices includes a plurality of distributed process systems, each having a plurality of distributed processes, wherein each distributed process is wholly dedicated to the computing requirements for a different single vehicle in simulation.

19. The machine-useable storage medium of claim 15 being further configured to receive an array of sensor information gathered at various traffic locations by a real world data collection system.

20. The machine-useable storage medium of claim 15 being further configured to provide predicted traffic trajectory information for configuring a control system in an autonomous vehicle.

* * * * *